United States Patent
Roeckner et al.

(10) Patent No.: US 6,606,044 B2
(45) Date of Patent: Aug. 12, 2003

(54) METHOD AND APPARATUS FOR GENERATING A PULSE WIDTH MODULATED SIGNAL

(75) Inventors: William J. Roeckner, Carpentersville, IL (US); Pallab Midya, Schaumburg, IL (US); Poojan A. Wagh, Sleepy Hollow, IL (US); William J. Rinderknecht, Steamwood, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/034,909

(22) Filed: Jan. 2, 2002

(65) Prior Publication Data

US 2003/0122692 A1 Jul. 3, 2003

(51) Int. Cl.$^7$ ................................................ H03M 3/00
(52) U.S. Cl. ........................................ 341/143; 330/251
(58) Field of Search ................................ 341/143, 144, 341/145, 53; 332/184, 108, 167; 375/238; 329/303, 336; 382/167; 377/33

(56) References Cited

U.S. PATENT DOCUMENTS

| | | | | | |
|---|---|---|---|---|---|
| 4,001,728 | A | * | 1/1977 | Schneider | 332/184 |
| 4,533,874 | A | * | 8/1985 | Fischer | 329/303 |
| 4,931,751 | A | * | 6/1990 | Keller et al. | 332/108 |
| 5,204,635 | A | * | 4/1993 | Takeuchi | 329/336 |
| 5,337,338 | A | * | 8/1994 | Sutton et al. | 377/33 |
| 5,926,563 | A | * | 7/1999 | Yamazaki | 382/167 |
| 5,959,501 | A | * | 9/1999 | Chester | 330/251 |
| 6,304,200 | B1 | * | 10/2001 | Masuda | 341/144 |
| 6,317,067 | B1 | * | 11/2001 | Mohindra | 341/145 |
| 6,414,613 | B1 | * | 7/2002 | Midya et al. | 341/143 |
| 6,430,220 | B1 | * | 8/2002 | Determan | 375/238 |
| 6,459,398 | B1 | * | 10/2002 | Gureshnik et al. | 341/144 |
| 6,473,457 | B1 | * | 10/2002 | Pascual et al. | 375/238 |

FOREIGN PATENT DOCUMENTS

JP 406217210 A * 8/1994
WO WO99/20004 4/1999

OTHER PUBLICATIONS

Midya et al., "Prediction Correction Algorithm for Natural Pulse Width Modulation," Audio Engineering Society, 109th Convention Sep. 22–25, 2000, Los Angeles, CA, pp. 1–20.
Pascual et al., "Computationally Efficient Conversion from Pulse–Code–Modulation to Naturally–Sampled Pulse–Width–Modulation," Audio Engieering Society, 109th Convention Sep. 22–25, 2000, Los Angeles, CA, pp. 1–26.
Fremer, "Sharp SM–SC100 Digital Integrated Amplifier," Stereophile, Jul. 2000, pp. 73–79.
"Changing the Meaning of Pure Audio," Stereophile, Oct. 1999, 10 pgs.
Goldberg et al., "Pseudo–Natural Pulse Width Modulation for High Accuracy Digital–to–Analogue Conversion," Electronics Letters, IEE Stevenage, GB, vol. 27, No. 16, pp. 1491–1492 (1991).
Pascual et al., "High–Fidelity PWM Inverter for Audio Amplification Based On Real–Time DSP," IEEE, Proceedings, $7^{th}$ Workshop on Computers in Power Electronics, pp. 227–232 (2000).
PCT International Search Report.

* cited by examiner

Primary Examiner—Jean Bruner Jeanglaude
(74) Attorney, Agent, or Firm—Susan C. Hill

(57) ABSTRACT

A method and apparatus for a pulse width modulated (PWM) signal (30, 130) is provided. The input is a digital signal which is a modulated signal (24, 124). In the illustrated form, the modulated input signal is either a PDM signal or a PCM signal. In one embodiment of the present invention a PCM to PWM converter (16, 116) includes correction of duty ratio circuitry (48). The methodology used may include recursion on the values obtained after prediction, interpolation, and correction. The digital to analog conversion system (10) uses a PDM to PWM converter (20) which operates in an all digital domain and includes no analog circuitry.

20 Claims, 6 Drawing Sheets

METHOD AND APPARATUS FOR GENERATING A PULSE WIDTH MODULATED SIGNAL

FIELD OF THE INVENTION

This invention relates generally to pulse width modulation, and more specifically to converting either a pulse density modulated data stream or a pulse code modulated data stream to a pulse width modulated signal.

BACKGROUND OF THE INVENTION

Pulse width modulation (PWM) is a suitable method to create a power signal with high efficiency. In particular, many high efficiency digital audio switching power amplifiers are based on PWM signaling. Digital audio inputs to these amplifiers are typically pulse code modulated (PCM). Direct translation from PCM to PWM to generate a uniformly sampled PWM (UPWM) signal is a nonlinear operation that results in a large amount of harmonic distortion. In contrast, naturally sampled PWM (NPWM) does not contain harmonic distortion. Naturally sampled PWM signals are easily generated in the analog domain by comparing an analog input signal to a sawtooth or triangular shaped ramp signal. The NPWM pulse edges are determined by the natural crosspoints between the input analog signal and the ramp signal. However, calculating the natural crosspoints for NPWM in the digital domain based on PCM input data can be computationally expensive.

Super Audio Compact Disc (SACD) is a new digital audio data format. The audio is digitized and stored in Pulse Density Modulation (PDM) format. It consists of an oversampled (64*Fs, where Fs is the initial sampling rate) one-bit PDM data stream. It is desirable to convert the SACD bit stream (or any PDM bit stream) to a Pulse Width Modulated (PWM) signal that can be used to drive a highly efficient switching digital audio amplifier. The SACD PDM bit stream can be directly used as a switching signal; however this approach does not readily allow for the implementation of any desired signal processing (i.e. volume control, equalization, and the like).

Pulse density modulated signals (such as SACD) are typically noise shaped in order to push the quantization noise out of the frequency band of interest. This results in a frequency spectrum that contains a large amount of out-of-band noise.

A very high-end switching digital audio amplifier for SACD input has been commercially introduced. However, in order to accommodate volume control it cannot directly amplify the SACD PDM signal. Instead, it must treat the PDM input signal as an analog signal;that can be attenuated as desired for volume control. This signal then feeds a seventh-order one-bit sigma delta ADC modulator that generates a new PDM signal for amplification in a switching amplifier. A big drawback of this system is that the signal does not stay in the digital domain. The digital input signal is converted to analog to allow signal processing in the analog domain, then converted to digital (PDM) to drive a switching amplifier. All the advantages of maintaining a digital signal line-up are lost. Additionally, the use of a PDM signal to drive a switching amplifier has some disadvantages compared to using a PWM signal. For example, PWM has a lower average switching frequency, which results in greater efficiency compared to PDM. Furthermore, the non-return-to-zero (NRZ) nature of the PDM signal can result in increased distortion compared to the return-to-zero PWM signal. One might consider processing the high-speed one-bit PDM signal in the digital domain (volume control, equalization, etc.) followed by a digital sigma delta modulator. However, processing at such a high bit rate would be extremely costly.

Many common approaches of SACD demodulation and amplification consist of decimating the high sample rate PDM to a low sample rate PCM, performing signal processing, performing digital to analog conversion, and amplifying in the analog domain. A significant drawback to this approach is that all advantages of high efficiency digital switching amplification are lost.

Therefore, a computationally efficient method is desirable to convert both PDM and PCM encoded input signals to a PWM switching waveform entirely in the digital domain in order to advantageously drive a switching digital power amplifier. This method should be tolerant of out-of-band noise as typically found with PDM signals.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
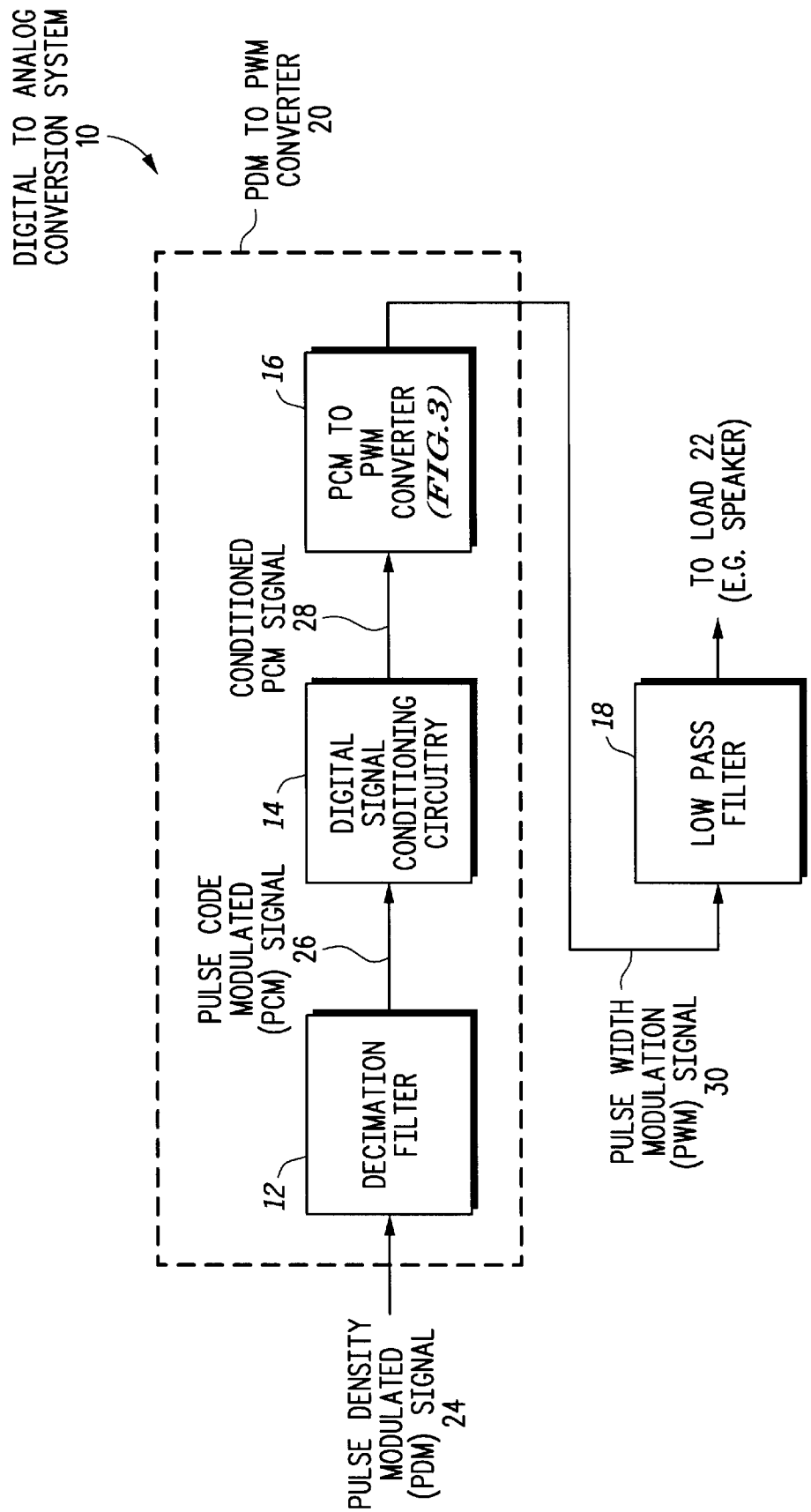
FIG. 1 illustrates one embodiment of a digital to analog conversion system in accordance with the present invention.

FIG. 1 illustrates one embodiment of a digital to analog conversion system 10. In one embodiment of the present invention digital to analog conversion system 10 receives a pulse density modulated (PDM) signal 24 as an input to PDM to PWM converter 20. PDM to PWM converter 20 then provides a pulse width modulation (PWM) signal 30 to low pass filter 18. Low pass filter 18 provides an analog signal as an output to a load 22 (not shown). In one embodiment load 22 may be an audio speaker. Other embodiments of the present invention may use other types of loads. In one embodiment of the present invention PDM to PWM converter 20 includes a decimation filter 12, digital signal conditioning circuitry 14, and a PCM to PWM converter 16. In one embodiment decimation filter 12 receives PDM signal 24 as an input and provides pulse code modulated (PCM) signal 26 as an output. Note that PDM signal 24 has a one-bit resolution at a high sample rate. Decimation filter 12 decreases the sample rate and increases the bit resolution resulting in a pulse code modulation (PCM) signal 26. Digital signal conditioning circuitry 14 receives PCM signal 26 as an input and provides a conditioned PCM signal 28 as an output. PCM to PWM converter 16 receives the conditioned PCM signal 28 as an input and provides the PWM signal 30 as an output to low pass filter 18. Note that alternate embodiments of the present invention may optionally include an amplifier as part of digital to analog conversion system 10. For example, an amplifier (not shown) may optionally be included between converter 16 and low pass filter 18. Alternately an optional amplifier (not shown) may instead be included between low pass filter 18 and load 22. Note that alternate embodiments of the present invention may combine the functionality of decimation filter 12 and digital signal conditioning circuitry 14 in any way. What is important is that the functionality of circuits 12 and 14 receive a PDM signal 24 as an input and provide a conditioned PCM signal as an output. The digital signal conditioning that is performed by digital signal conditioning circuitry 14 may vary significantly. For example, some embodiments of the present invention may use digital signal conditioning circuitry 14 to provide volume control, graphic equalization, and any other desired digital effects or processing. Alternatively, the digital signal conditioning may be performed before the decimation filter function.

Figure 2:
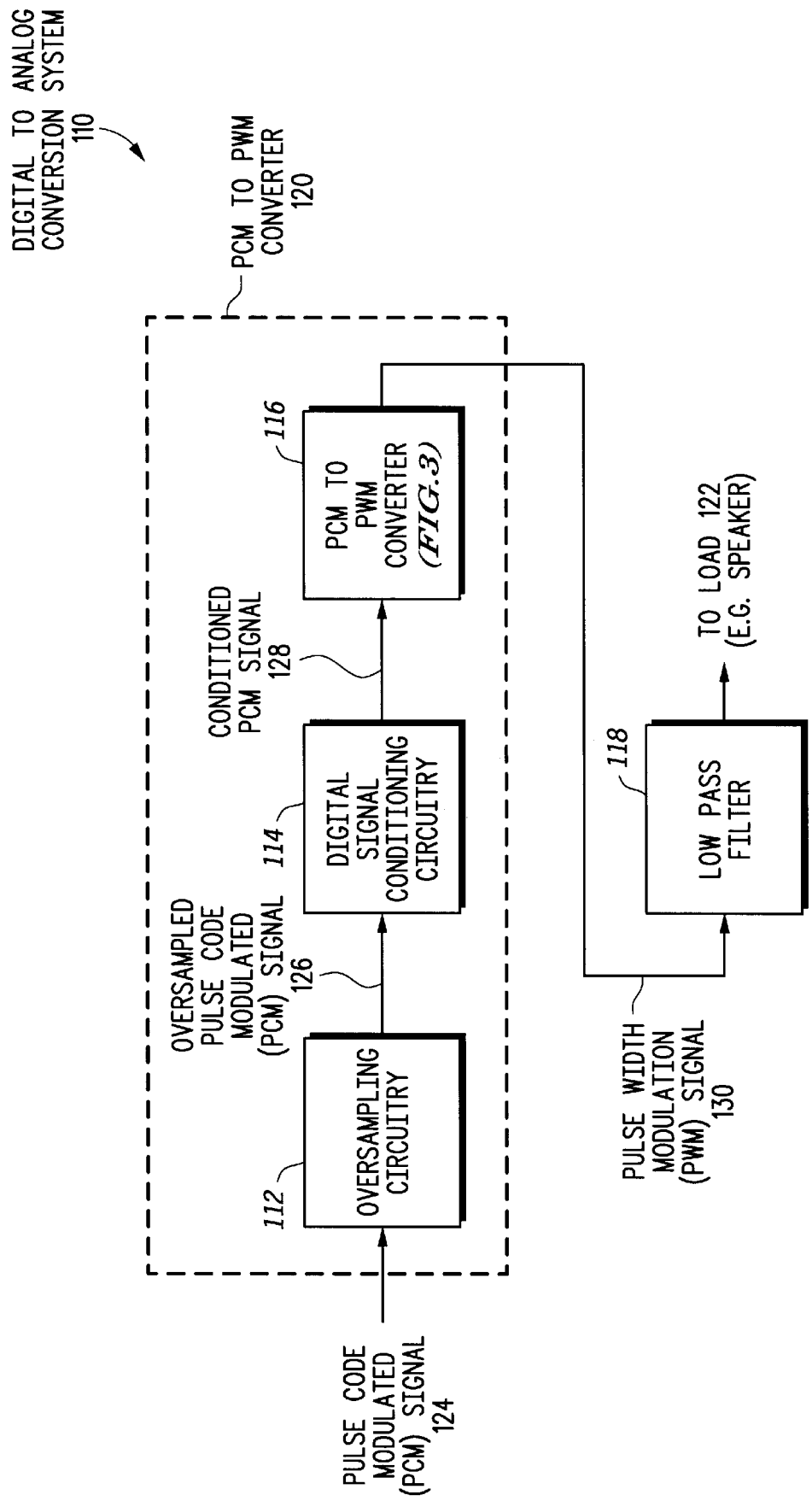
FIG. 2 illustrates another embodiment of a digital to analog conversion system in accordance with the present invention.

FIG. 2 illustrates one embodiment of a digital to analog conversion system 110. In one embodiment of the present invention, digital to analog conversion system 110 receives a pulse code modulated (PCM) signal 124 as an input to PCM to PWM converter 120. PCM to PWM converter 120 then provides a pulse width modulation (PWM) signal 130 to low pass filter 118. Low pass filter 118 provides an analog signal as an output to a load 122 (not shown). In one embodiment load 122 may be an audio speaker. Other embodiments of the present invention may use other types of loads. In one embodiment of the present invention PCM to PWM converter 120 includes over sampling circuitry 112, digital signal conditioning circuitry 114, and a PCM to PWM converter 116. In one embodiment, over sampling circuitry 112 receives PCM signal 124 as an input and provides over sampled pulse code modulated (PCM) signal 126 as an output. Digital signal conditioning circuitry 114 receives over sampled pulse code modulated (PCM) signal 126 as an input and provides a conditioned PCM signal 128 as an output. PCM to PWM converter 116 receives the conditioned PCM signal 128 as an input and provides the PWM signal 130 as an output to low pass filter 118. Note that alternate embodiments of the present invention may optionally include an amplifier as part of digital to analog conversion system 110. For example, an amplifier (not shown) may optionally be included between converter 116 and low pass filter 118. Alternately an optional amplifier (not shown) may instead be included between low pass filter 118 and load 122. Note that alternate embodiments of the present invention may combine the functionality of over sampling circuitry 112 and digital signal conditioning circuitry 114 in any way. What is important is that the functionality of circuits 112 and 114 receive a PCM signal 124 as an input and provide a conditioned PCM signal as an output. The digital signal conditioning that is performed by digital signal conditioning circuitry 114 may vary significantly. For example, some embodiments of the present invention may use digital signal conditioning circuitry 114 to provide volume control, graphic equalization, and any other desired digital effects or processing. Alternatively, the digital signal conditioning may be performed before the over sampling circuitry function.

Figure 3:
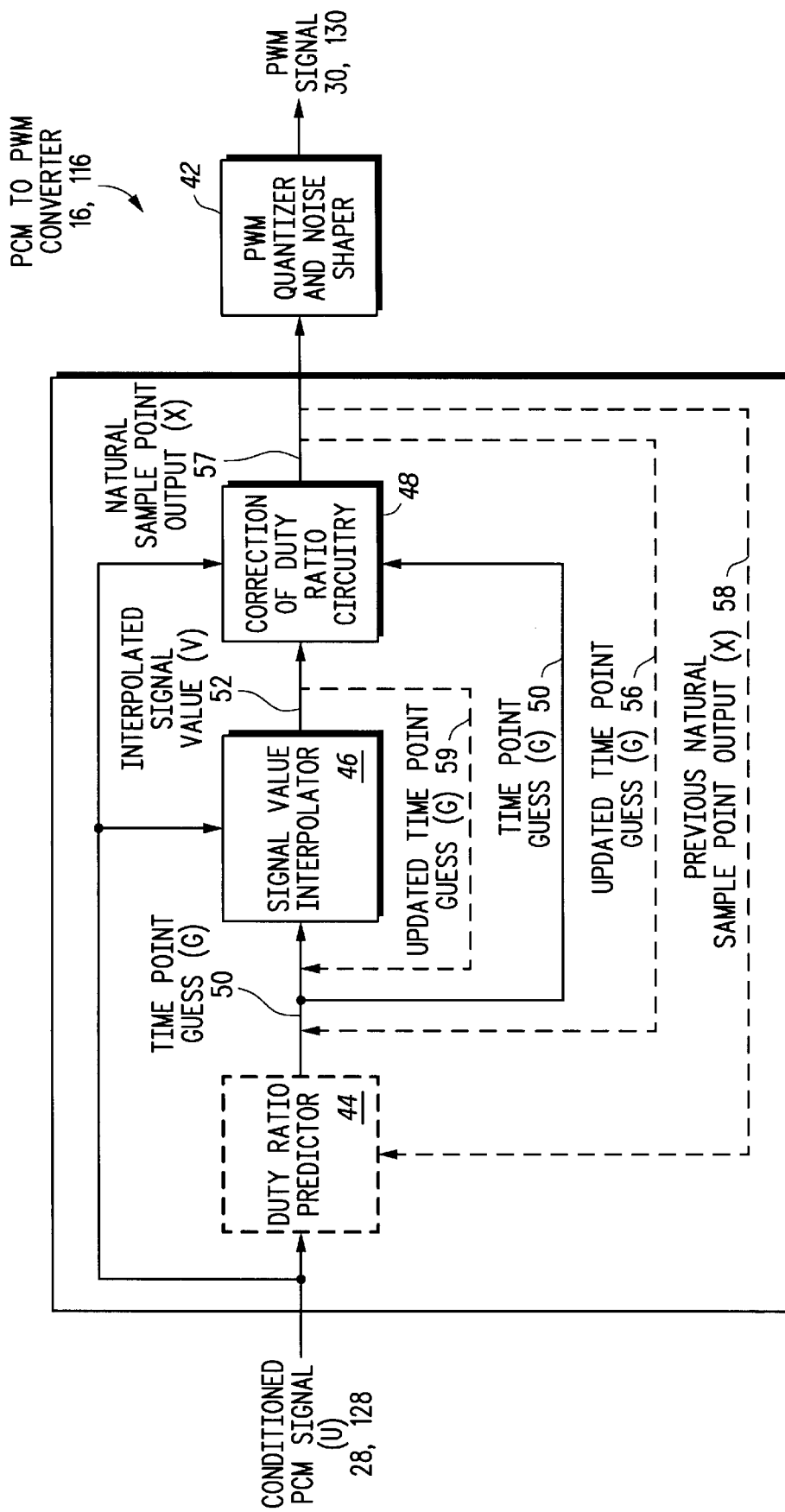
FIG. 3 illustrates one embodiment of a PCM to PWM converter in accordance with the present invention.

FIG. 3 illustrates one embodiment of a PCM to PWM converter 16 illustrated in FIG. 1 and a PCM to PWM converter 116 illustrated in FIG. 2. Note that although the PCM to PWM converter 16, 116 are both being illustrated by FIG. 3, alternate embodiments of digital to analog conversion system 10 illustrated in FIG. 1 and digital to analog conversion system 110 illustrated in FIG. 2 may use different embodiments of the PCM to PWM converter 16, 116. Note that for FIG. 3, optional circuitry and connections have been illustrated using dashed lines. In one embodiment PCM to PWM converter 16, 116 includes natural sampling circuitry 40 and PWM quantizer and noise shaper 42. In one embodiment, natural sampling circuitry 40 receives a conditioned PCM signal (U) 28, 128 as, an input and provides natural sample point output (X) 57 as an output. PWM quantizer and noise shaper 42 receives natural sample point output (X) 57 as an input and provides PWM signal 30, 130 as an output. In one embodiment of the present invention natural sampling circuitry 40 includes duty ratio predictor 44, signal value interpolator 46, and correction of duty ratio circuitry 48. In one embodiment of the present invention, duty ratio predictor 44 receives conditioned PCM signal (U) 28, 128 as an input signal and provides time point guess (G) 50 as an output. Signal value interpolator 46 receives time point guess (G) 50 as an input signal and provides interpolated signal value (V) 52 as an output. Correction of duty ratio circuitry 48 receives interpolated signal value (V) 52 as an input and provides natural sample point output (X) 57 as an output. In one embodiment of the present invention, the natural sample point output (X) 57 is provided as feedback to the duty ratio predictor 44 as a previous natural sample point output (X) 58. Also, in some embodiments of the present invention, the natural sample point output (X) 57 is fed back as updated time point guess (G) 56 input to signal value interpolator 46. Also, in some embodiments of the present invention, the interpolated signal value (V) 52 is fed back as updated time point guess (G) 59. Note that the feedback paths 56, 58 and 59 are optional and may or may not be included in various embodiments of the present invention. Note also that the duty ratio predictor 44 is optional. Some embodiments of the present invention may directly provide the conditioned PCM signal (U) 28, 128 to signal value interpolator 46. Note that the time point guess (G) 50 signal is also provided as an input to the correction of duty ratio circuitry 48. Note that the conditioned PCM signal (U) 28, 128 is also provided as an input to the signal value interpolator 46 and the correction of duty ratio circuitry 48. Note that if the duty ratio predictor 44 is not used, then the time point guess (G) signal 50 is merely the same as the conditioned PCM signal (U) 28, 128. The input to the PWM quantizer and noise shaper 42 is a natural sample point output (X) 57 which is a high resolution PWM signal. Thus, PWM quantizer and noise shaper 42 quantizes this high resolution PWM signal to produce a lower resolution quantized PWM signal 30, 130. In one embodiment, the noise shaping function of circuitry 42 shapes the quantization noise outside the pass band.

Still referring to FIG. 3, in one embodiment of the present invention, the addition of the correction of duty ratio circuitry 48 may greatly increase the accuracy of the natural sample point output (X) signal 57 which is generated by converter 16, 116. In fact, the addition of correction of duty ratio circuitry 48 to converter 16, 116 may allow the duty ratio predictor 44 to be eliminated entirely for some applications. However, alternate embodiments of the present invention may use a combination of correction of duty ratio circuitry 48 and duty ratio predictor circuitry 44. The addition of the correction of duty ratio circuitry 48 may reduce the number of calculations and the amount of memory required by converter 16, 116. The addition of correction of duty ratio circuitry 48 also greatly improves the distortion performance of the natural sample point output (X) signal 57, and thus also the distortion performance of PWM signal 30, 130. In addition, the correction of duty ratio circuitry 48 produces a natural sample point output (X) signal 57 which is less sensitive to out-of-band noise. This is especially important because PDM signal 24 (see FIG. 1) normally has a significant amount of out-of-band noise.

Figure 4:
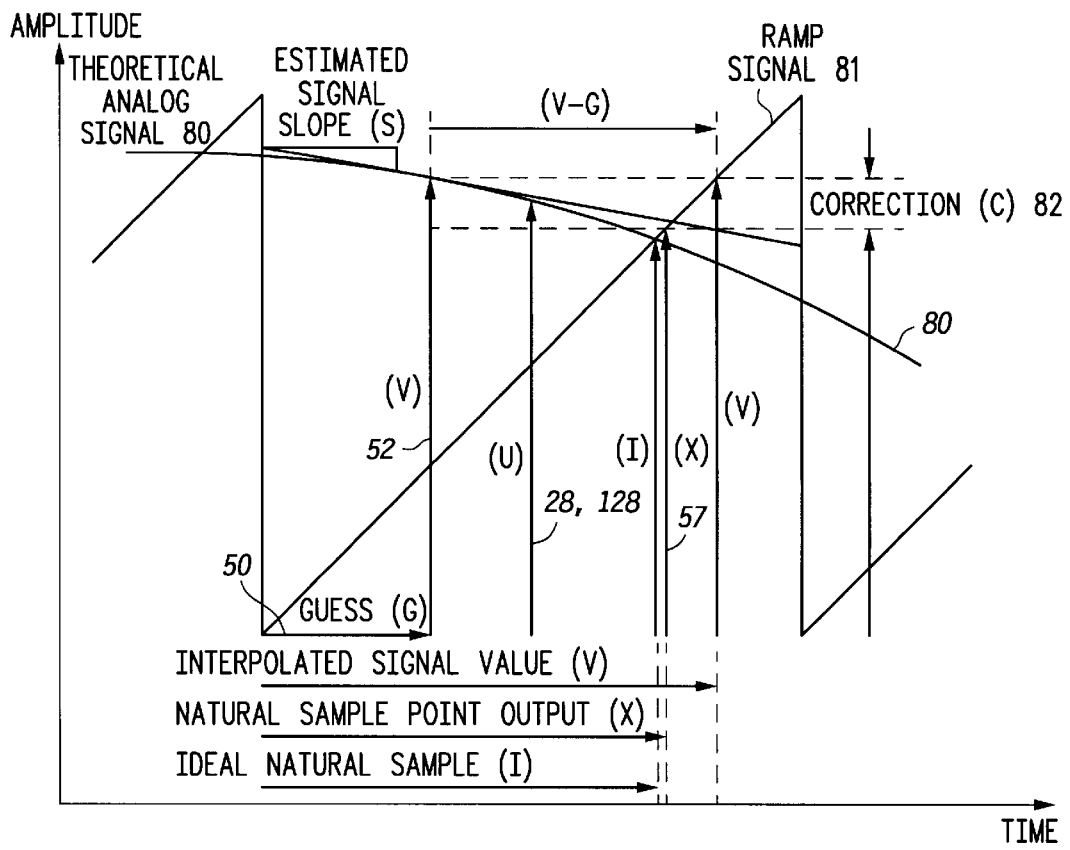
FIG. 4 illustrates several signals used in natural sampling circuitry in accordance with the present invention.
Figure 5:
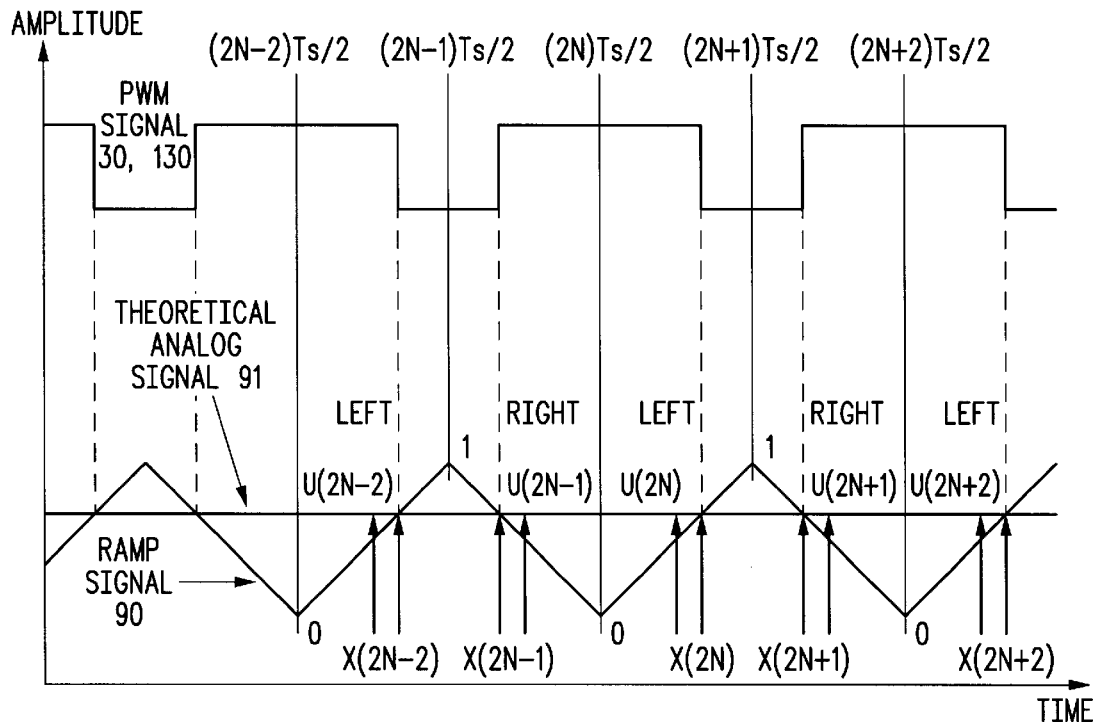
FIG. 5 illustrates one embodiment of a timing diagram for two sided PWM signals.

FIG. 4 illustrates a time domain representation of some of the signals used and/or generated in natural sampling circuitry 40 (see FIG. 3) in which a single sided PWM signal is generated by using a saw tooth shaped ramp signal 81. Alternate embodiments of the present invention may use a ramp other than a saw tooth shape. For example, FIG. 5 illustrates one embodiment of a timing diagram for a two-sided PWM signal with a symmetric triangular shaped ramp signal 90. The left half of the ramp signal 90 is when the ramp is rising and the right half of the ramp signal 90 is when the ramp is falling. The individual samples of conditioned PCM signal (U) 28, 128 are chosen to line up with the centers of the ramp signal 81 or the ramp signal 90. Theoretical analog signal 80 and theoretical analog signal 91 represent the ideal analog signal corresponding to the samples of conditioned PCM signal (U) 28, 128. A two sided example PWM signal 30, 130 is illustrated in FIG. 5. The conditioned PCM signal (U) 28, 128 is chosen to have even time indices during the left half while the odd indices line up with the right half of the PWM signal 30, 130.

Referring to FIG. 3 and FIG. 4, the time point guess (G) signal 50 is used to compute the value of the interpolated signal value (V) 52 using the conditioned PCM (U) signal 28, 128. Interpolated signal value (V) 52 is not equal to the time point guess (G) 50 unless all error is eliminated. The difference (V-G) is multiplied with the estimated signal slope (S) of theoretical analog signal 80 to compute a correction. (C) 82. The natural sample point output (X) signal 57 is the corrected signal. Note that for one embodiment of the present invention, the ramp signal 81 was chosen to rise linearly between 0 and 1.

Figure 6:
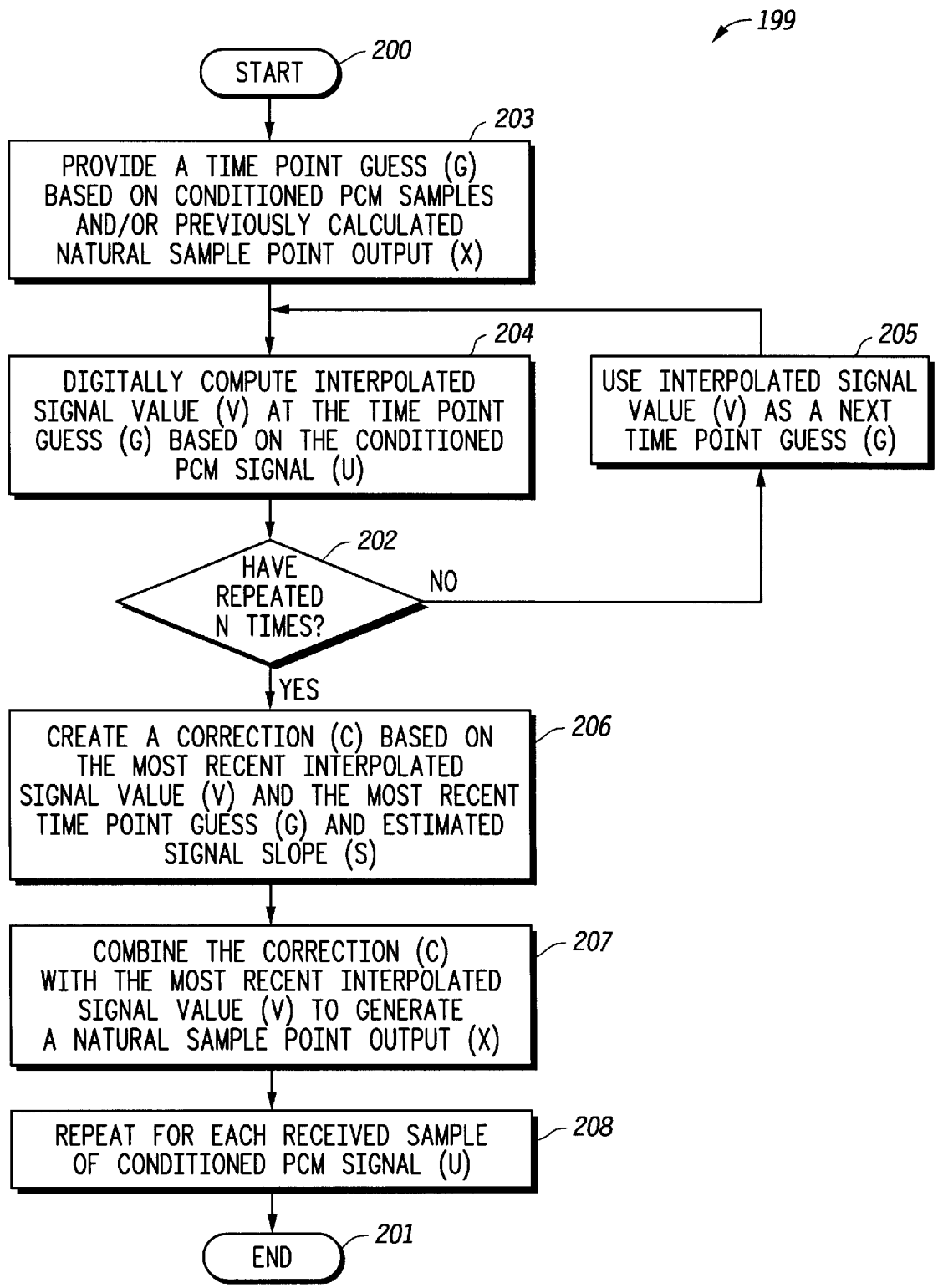
FIG. 6 illustrates in flow chart form the functionality carried out by natural sampling circuitry in accordance with one embodiment of the present invention.

FIG. 6 illustrates, in flow chart form, the functionality carried out by one embodiment of natural sampling circuitry 40 of FIG. 3. In one embodiment, flow 199 begins as start oval 200 and proceeds to step 203 where a guess time (G) is provided. Step 203 provides a guess time (G) which is based on the conditioned PCM samples and/or the previously calculated natural sample point output (X). Flow 199 then proceeds to step 204 where the interpolated signal value (V) at the time point guess (G) is digitally computed based on the conditioned PCM signal (U). Flow 199 then continues with decision diamond 202 where the determination is made as to whether it is necessary to repeat step 204 using the interpolated signal value (V) as a next time point guess (G). Note the decision diamond 202 may be used to repeat step 204 N times, where N is an integer greater than or equal to zero. Thus, if N equals 0, step 204 is executed only once and no recursive looping occurs. Note that step 205 merely indicates that step 204 will use the interpolated signal value (V) as a next time point guess (G). After repeating step 204 N times, flow 199 continues at step 206 where a correction (C) based on the most recent interpolated signal value (V) and the most recent time point guess (G) and estimated signal slope (S) are created. From step 206 flow 199 continues at step 207 where the correction (C) is combined with the most recent interpolate signal value (V) to generate a natural sample point output (X). From step 207, flow 199 continues at step 208 where the entire flow of 199 is repeated for each sample of conditioned PCM signal (U). From step 208, flow 199 continues at oval 201 where flow 199 ends. In alternate embodiments of the present invention, steps 206 and 207 may be moved to before decision diamond 202 so that steps 206 and 207 are repeated as part of the iterative recursion loop. Note that for some embodiments of the present invention, the number used for N in decision diamond 202 may be a function of one of the values used in flow 199. For example, the value N in decision diamond 202 may be a function of the correction value (C). Note that alternate embodiments of the present invention may use any appropriate method to provide a time point guess (G) as required by step 203. One example of a method for providing a time point guess (G) is described in U.S. patent application Ser. No. 09/478,024, Pallab Midya et al., filed Jan. 5, 2000.

It can be shown that for a given order of interpolation, the flow described in FIG. 6 which is performed by converter 16, 116 generates a natural sample point output (X) which is nearly optimal compared to the ideal natural sample point for that order.

A mathematical description of one embodiment of the invention will be given using the following variables:

Sample index n

Conditioned PCM signal U(n) 28,128

Time point guess G(n) 50

Interpolated signal value V(n) 52

Correction signal C(n) 82

Natural sample point output X(n) 57

Time point guess for natural sampling at the first iteration: $G_1(n)$

Interpolated signal value obtained by interpolation at the sample point at the first iteration: $V_1(n)$ Correction to the signal value at the first iteration: $C_1(n)$ Natural sample point output at the first iteration: $X_1(n)$ Time point guess for natural sampling at the second iteration: $G_2(n)$ Interpolated signal value obtained by interpolation at the sample point at the second iteration: $V_2(n)$ Correction to the signal value at the second iteration: $C_2(n)$ Natural sample point output at the second iteration: $X_2(n)$ The first step is to determine an initial time point guess (G) 50. In its most general form, it is derived from a combination of previous, present and future samples of conditioned PCM signal (U) 28, 128 as well as past-calculated samples of natural sample point ouput (X) 57. Example cases are as follows.

$$G(n) = U(n) + [2\{X(n-1) - U(n-1)\} - \{X(n-2) - U(n-2)\}] \quad [1]$$

or $$G(n) = U(n) + \{X(n-1) - U(n-1)\} \quad [2]$$

or $$G(n) = U(n) \quad [3]$$

The interpolated signal value (V) 52 of the theoretical analog signal 80, 91 at the guess time point is computed based on an interpolation formula. It is observed that for some embodiments of the present invention, better accuracy may be achieved when the uniform samples of conditioned PCM signal (U) 28, 128 are lined up with the center of the ramps 81, 90. Using this approach for two sided PWM (see FIG. 5), the interpolated signal value (V) 52 for the left sided PWM case can be calculated as follows.

$$V(2n) = U(2n) + \left\{G(2n) - \frac{1}{2}\right\}\left\{\frac{U(2n+1) - U(2n-1)}{2}\right\} + \quad [4]$$
$$\left\{\frac{U(2n+1) + U(2n-1) - 2U(2n)}{2}\right\}\left\{G(2n) - \frac{1}{2}\right\}^2$$

For the right hand side a similar equation holds.

$$V(2n+1) = U(2n+1) + \left\{\frac{1}{2} - G(2n+1)\right\}\left\{\frac{U(2n+2) - U(2n)}{2}\right\} + \quad [5]$$
$$\left\{\frac{U(2n+2) + U(2n) - 2U(2n+1)}{2}\right\}\left\{\frac{1}{2} - G(2n+1)\right\}^2$$

Both of these equations are based on a three-point second order Lagrange interpolation formula. Other orders of Lagrange interpolation, as well as other types of interpolation formula, may be substituted based on accuracy and computational constraints.

The next step is the correction step. The correction step is based on the idea that if the time point guess (G) is close to the ideal natural sample time point, the value of the interpolated signal value (V) 52 is very close to the ramp. Thus, the signal value (V) must be very close to the time point guess (G). Any difference implies that the time point guess (G) is not entirely accurate and can be corrected assuming that the signal is sufficiently slowly moving. A first order correction for both the left side PWM and the right side PWM, respectively, is given below.

$$C(2n) = \{V(2n) - G(2n)\}\left\{\frac{U(2n+1) - U(2n-1)}{2}\right\} \quad [6]$$

$$C(2n+1) = \{V(2n+1) - G(2n+1)\}\left\{\frac{U(2n+2) - U(2n)}{2}\right\} \quad [7]$$

In both cases the corrected natural sample point output is determined by simply summing the interpolated signal value and the correction signal value.

$$X(m) = V(m) + C(m) \quad [8]$$

The correction term improves accuracy. Recursion can be introduced further improve accuracy. Typically, two iterations improve accuracy significantly. Recursion can be implemented by using the corrected natural sample point output as a new time point guess as given by the equations below.

$$V_1(2n) = U(2n) + \left\{G_1(2n) - \frac{1}{2}\right\}\left\{\frac{U(2n+1) - U(2n-1)}{2}\right\} + \quad [9]$$
$$\left\{\frac{U(2n+1) + U(2n-1) - 2U(2n)}{2}\right\}\left\{G_1(2n) - \frac{1}{2}\right\}^2$$

$$C_1(2n) = \{V_1(2n) - G_1(2n)\}\left\{\frac{U(2n+1) - U(2n-1)}{2}\right\} \quad [10]$$

$$G_2(2n) = X_1(2n) = V_1(2n) + C_1(2n) \quad [11]$$

The steps in equations (9–11) can be repeated for improved accuracy. The amount of recursion needed to achieve a given accuracy is dependent on the oversampling ratio. If the signal is moving fast and changing significantly from sample to sample, corresponding to a low oversampling ratio, the need for recursion increases. This comes with added computational and memory requirements. The complexity of each of the time point estimation, interpolation to compute signal value, and correction of signal value steps are variable depending on the accuracy required. Depending on the accuracy requirement, as well as constraints on memory and computation, an optimal algorithm can be designed. As an example, for one embodiment of a digital audio amplifier system with an input signal constrained to 20 kHz bandwidth and a 375 kHz PWM switching frequency, the following left hand side equations can be used to achieve extremely good results.

$$G(2n) = U(2n) \quad [12]$$

$$V(2n) = U(2n) + \left\{U(2n) - \frac{1}{2}\right\}\left\{\frac{U(2n+1) - U(2n-1)}{2}\right\} + \quad [13]$$
$$\left\{\frac{U(2n+1) + U(2n-1) - 2U(2n)}{2}\right\}\left\{U(2n) - \frac{1}{2}\right\}^2$$

$$X(2n) = V(2n) + \{V(2n) - G(2n)\}\left\{\frac{U(2n+1) - U(2n-1)}{2}\right\} \quad [14]$$

The corresponding right hand side equations are as follows.

$$G(2n+1) = U(2n+1) \quad [15]$$

$$V(2n+1) = U(2n+1) + \left\{\frac{1}{2} - U(2n+1)\right\}\left\{\frac{U(2n+1) - U(2n-1)}{2}\right\} + \quad [15]$$
$$\left\{\frac{U(2n+2) + U(2n) - 2U(2n+1)}{2}\right\}\left\{\frac{1}{2} - U(2n+1)\right\}^2$$

$$X(2n+1) = V(2n+1) + \{V(2n+1) - G(2n+1)\}\left\{\frac{U(2n+2) - U(2n)}{2}\right\} \quad [16]$$

Note that in this example the initial time point guess (G) 50 has been chosen to be the input conditioned PCM signal (U) 28, 128. Since the conditioned PCM signal (U) 28, 128 is already available, there is no computation or memory storage associated with the guess. There are eleven multiply or add computations associated with the calculation of the interpolated signal value (V) 52. There are four memory storage locations needed for this step. Calculation of the corrected natural sample point output requires an additional two add or multiply operations and uses one memory storage location. Thus, for this example, the total is thirteen operations and five memory storage locations needed per sample. For a 375 kHz switching frequency with two samples per switching cycle, the total computation is 9.75 million operations per second. The low total memory requirement is particularly beneficial for reducing overall computation overhead.

Note that the direct translation from PCM to PWM is a non-linear operation which results in an unacceptable total harmonic distortion if a converter such as PCM to PWM converter 16, 116 is not used. Note that the conversion process performed by PCM to PWM converter 16, 116 produces a highly linear output and thus does not add significant harmonic components to the PWM signal 30, 130. Also note that the conversion process performed by PCM to PWM converter 16, 116 is highly tolerant to large amounts of shaped wide band noise often associated with pulse density modulated input signals such as SACD.

The addition of the correction of duty ratio circuitry 48 in FIG. 3 may result in a more efficient PCM to PWM converter 16, 116. This PCM to PWM converter 16, 116 can be used for both single and two sided PWM signals. Referring to FIG. 6, the recursion which may be performed on one or more of steps 204, 206, and 207 allow the PCM to PWM converter 16, 116 to produce a more accurate PWM signal 30, 130 that has less harmonic distortion and approaches the theoretical limits of accuracy.

In one embodiment, the present invention is an all-digital architecture to take the new SACD audio format and convert it into a digital PWM signal for driving a highly efficient digital -switching amplifier. Note that this architecture easily accommodates the handling of volume control, graphic equalization and other desired digital signal processing functions entirely in the digital domain. Thus, the architecture illustrated by the present invention maintains a complete digital path from the PDM input signal all the way to the amplified digital PWM output signal. However, although the present invention has been illustrated in the context of audio signal processing, it is important to note that the present invention is applicable to any type of digital signal processing application in which a pulse density modulated data stream or a pulse code modulated data stream is converted to a pulse width modulated signal. Audio signal processing is just one such application.

The PCM to PWM converter 16, 116 illustrated in FIG. 3 as well as the methodology described in FIG. 6 may be used for a wide variety of frequencies, including radio frequencies. For example, the disclosed circuitry and methodology may be used as part of a radio frequency amplifier.

Figure 7:
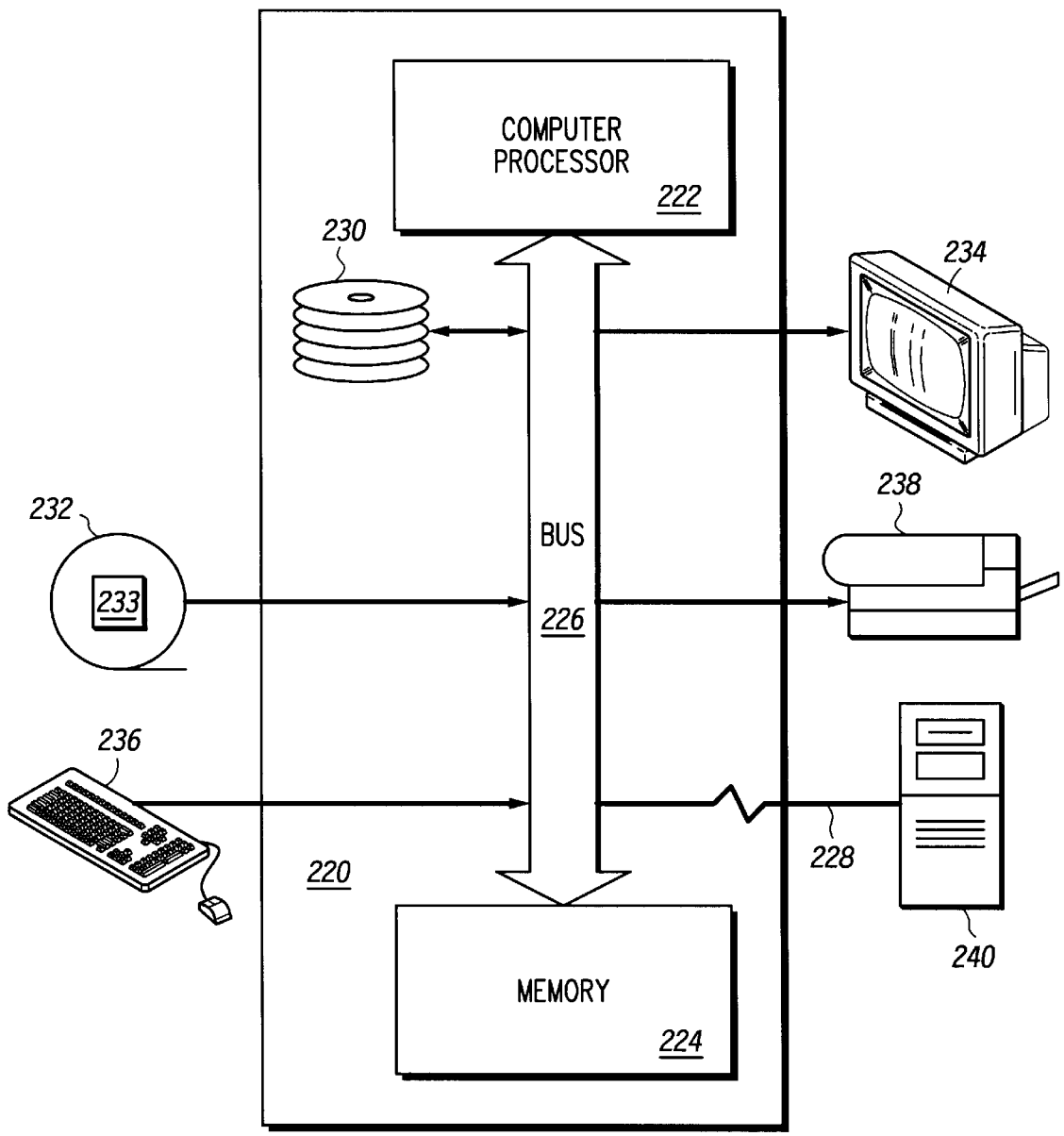
FIG. 7 is a block diagram illustrating a General Purpose Computer used to implement one embodiment of the present invention.

FIG. 7 is a block diagram illustrating a General Purpose Computer 220 used to implement one embodiment of the present invention. General Purpose Computer 220 includes a Computer Processor 222 and Memory 224, connected by a Bus 226. Memory 224 is a relatively high speed machine-readable medium and includes Volatile Memories such as DRAM, and SRAM, and Non-Volatile Memories such as, ROM, FLASH, EPROM, EEPROM, and bubble memory. Also connected to the Bus are Secondary Storage 230, External Storage 232, output devices such as monitor 234, input devices such as keyboard (with mouse) 236, printers 238, and one or more other computers 240 coupled by way of communication link 228. Secondary Storage 230 includes machine-readable media such as hard disk drives, magnetic drum, and bubble memory. External -Storage 232 includes machine-readable media such as floppy disks, removable hard drives, magnetic tape, CD-ROM, and even other computers, possibly connected via a communications line. The distinction drawn here between Secondary Storage 230 and External Storage 232 is primarily for convenience in describing the invention. As such, it should be appreciated that there is substantial functional overlap between these elements. Computer software 233 including user programs can be stored in a Computer Software Storage Medium such as memory 224, Secondary Storage 230, and External Storage 232. Secondary Storage 230 and Non-Volatile Memory are loaded for execution directly into Volatile Memory, executed directly out of Non-Volatile Memory, or stored in Secondary Storage 230 prior to loading into Volatile Memory for execution.

Because the apparatus implementing the present invention is, for the most part, composed of electronic components and circuits known to those skilled in the art, circuit details will not be explained in any greater extent than that considered necessary, as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for generating a pulse width modulated signal, comprising:

receiving a modulated input signal in a digital format, the modulated input signal being in pulse density modulation (PDM) form; and converting the modulated input signal to pulse width modulated (PWM) form to provide the pulse width modulated signal, the converting being performed entirely in a digital format.

2. The method of claim 1 wherein the converting further comprises:

decimating the modulated input signal to reduce a sampling rate of the modulated input signal and to increase resolution of the modulated input signal.

3. The method of claim 1 wherein the converting further comprises:

conditioning the modulated input signal by modifying at least one of amplitude and frequency response of the modulated input signal.

4. The method of claim 1 wherein the converting further comprises for each of a plurality of predetermined samples:

predicting a natural sample time point for sampling the modulated input signal;

interpolating the modulated input signal at the predicted natural sample time point to provide an interpolated signal value;

providing a correction value to correct error associated with the natural sample time point which was predicted, the correction value provided by using the interpolated signal value, the natural sample time point which was predicted and an estimated signal slope value; and combining the correction value and the interpolated signal value to provide a corrected natural sample point output.

5. The method of claim 1 wherein the converting further comprises:

decimating the modulated input signal to provide a decimated signal, the decimating reducing a sampling rate of the modulated input signal and increasing resolution of the modulated input signal; and conditioning the decimated signal by modifying at least one of amplitude and frequency response of the modulated input signal.

6. The method of claim 5 further comprising:

filtering the pulse width modulated signal to make the pulse width modulated signal suitable for driving a load by rejecting predetermined frequency components.

7. The method of claim 6 further comprising:

filtering the pulse width modulated signal with a low pass filter.

8. The method of claim 1 further comprising:

filtering the pulse width modulated signal to make the pulse width modulated signal suitable for driving a load by rejecting predetermined frequency components.

9. An apparatus for generating a pulse width modulated signal, comprising:

an input terminal for receiving a modulated input signal in a digital format, the modulated input signal being in pulse density modulation (PDM) form; and a converter coupled to the input terminal, the converter converting the modulated input signal to pulse width modulated form to provide the pulse width modulated signal, the converting being performed by the converter entirely in a digital format.

10. The apparatus of claim 9 wherein the converter further comprises:

a decimation filter coupled to the input terminal for decimating the modulated input signal to reduce a sampling rate of the modulated input signal and to increase resolution of the modulated input signal.

11. The apparatus of claim 9 wherein the converter further comprises:

digital signal conditioning circuitry for conditioning the modulated input signal prior to converting the modulated input signal to pulse width modulated form.

12. The apparatus of claim 11 wherein the digital signal conditioning circuitry modifies at least one of amplitude or frequency response of the modulated input signal.

13. The apparatus of claim 9 wherein the converter further comprises:

a decimation filter coupled to the input terminal for decimating the modulated input signal to reduce a sampling rate of the modulated input signal and to increase resolution of the modulated input signal; and digital signal conditioning circuitry coupled to the decimation filter, the digital signal conditioning circuitry conditioning the modulated input signal prior to converting the modulated input signal to pulse width modulated form.

14. The apparatus of claim 13 further comprising:

a filter coupled to the digital signal conditioning circuitry for filtering the pulse width modulated signal to make the pulse width modulated signal suitable for driving a load by rejecting predetermined frequency components.

15. An apparatus of claim 14 wherein the filter further comprises a low pass filter.

16. A method for generating a pulse width modulated signal, comprising:

receiving a modulated input signal, the modulated signal being in either pulse code modulated (PCM) form or pulse density modulated (PDM) form;

converting the modulated input signal to pulse width modulated form to provide the pulse width modulated signal, the converting being performed entirely in a digital format, the converting further comprising for each of a plurality of predetermined samples:

predicting a natural sample time point for sampling the modulated input signal;

interpolating the modulated input signal at the natural sample time point to provide an interpolated signal value;

providing a correction value to correct error associated with the natural sample time point which was predicted, the correction value provided by using the interpolated signal value, the natural sample time point which was predicted and an estimated signal slope value; and combining the correction value and the interpolated signal value to provide a corrected natural sample point output.

17. The method of claim 16 further comprising:

selectively repeating the interpolating of the modulated input signal N times, where N is zero or a positive integer, wherein a most recently determined interpolated signal value is used as a new predicted natural sample time point.

18. The method of claim 16 further comprising:

selectively repeating the interpolating of the modulated input signal, the providing of the correction value and the combining N times, where N is zero or a positive integer, wherein a most recently determined corrected natural sample point is used as a new predicted natural sample point.

19. An apparatus for generating a pulse width modulated signal, the apparatus comprising:

an input terminal for receiving a modulated input signal, the modulated signal being in either pulse code modulated (PCM) form or pulse density modulated (PDM) form; and a converter for converting the modulated input signal to pulse width modulated form to provide the pulse width modulated signal, the converting being performed entirely in a digital format, the converter further comprising:

a duty ratio predictor for predicting a natural sample time point for sampling the modulated input signal;

a signal value interpolator coupled to the duty ratio predictor, the signal value interpolator interpolating the modulated input signal at the natural sample time point to provide an interpolated signal value; and a correction circuit coupled to the signal value interpolator, the correction circuit providing a correction value to correct error associated with the natural sample time point which was predicted, the correction value provided by using the interpolated signal value, the natural sample time point which was predicted and an estimated signal slope value, the correction circuit combining the correction value and the interpolated signal value to provide a corrected natural sample point output.

20. The apparatus of claim 19 further comprising:

a pulse width modulation quantizer and noise shaper circuit coupled to the correction circuit, the pulse width modulation quantizer and noise shaper circuit modifying a resolution of the pulse width modulated signal and selectively shaping noise content associated with a quantization operation.

* * * * *